(12) United States Patent
Bogner et al.

(10) Patent No.: US 8,003,998 B2
(45) Date of Patent: Aug. 23, 2011

(54) LIGHT-EMITTING DIODE ARRANGEMENT

(75) Inventors: Georg Bogner, Lappersdorf (DE);
Stefan Grötsch, Lengfeld/Bad Abbach (DE); Günter Waitl, Regensburg (DE);
Mario Wanninger, Harting (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/631,058

(22) PCT Filed: May 18, 2005

(86) PCT No.: PCT/DE2005/000904
§ 371 (c)(1),
(2), (4) Date: Jan. 31, 2008

(87) PCT Pub. No.: WO2006/002603
PCT Pub. Date: Jan. 12, 2006

(65) Prior Publication Data
US 2008/0315227 A1 Dec. 25, 2008

(30) Foreign Application Priority Data

Jun. 30, 2004 (DE) .................. 10 2004 031 686
Sep. 22, 2004 (DE) .................. 10 2004 045 947

(51) Int. Cl.
*H01L 33/00* (2010.01)
(52) U.S. Cl. ............ 257/98; 257/88; 257/E33.068
(58) Field of Classification Search ............ 257/98, 257/676, 79, 13, 82, 95, 436, E25.032, E51.018, 257/E33.001, E33.005, E33.058, E33.067, 257/E31.095, E31.099, 88, E33.068, 99, 257/18; 438/25, 27; 313/483, 498, 512, 313/503, 502, 113, 114; 362/249, 800, 612, 208
See application file for complete search history.

(56) References Cited

U.S. PATENT DOCUMENTS

| | | | |
|---|---|---|---|
| 5,065,226 A * | 11/1991 | Kluitmans et al. | 257/433 |
| 5,130,531 A * | 7/1992 | Ito et al. | 250/216 |
| 5,684,309 A | 11/1997 | McIntosh et al. | |
| 5,831,277 A | 11/1998 | Razeghi | |
| 6,066,861 A | 5/2000 | Höhn et al. | |

(Continued)

FOREIGN PATENT DOCUMENTS

DE 19638667 4/1998

(Continued)

OTHER PUBLICATIONS

Schnitzer, I. and Yablonovitch, E., "30% External Quantum Efficiency from Surface Textured, Thin-Film Light-Emitting Diodes", *Appl. Phys. Lett.* vol. 63, No. 16, pp. 2174-2176, 1993.

(Continued)

*Primary Examiner* — Thomas L Dickey
*Assistant Examiner* — Nikolay Yushin
(74) *Attorney, Agent, or Firm* — Fish & Richardson P.C.

(57) ABSTRACT

A light-emitting diode arrangement is disclosed, comprising at least one light-emitting diode (LED) chip with a radiation decoupling surface through which a large portion of the electromagnetic radiation generated in the LED chip exits in a main direction of emission; a housing laterally surrounding the LED chip; and a reflective optic disposed after the radiation decoupling surface in the main direction of emission. The LED arrangement is particularly well suited for use in devices such as camera-equipped cell phones, digital cameras or video cameras.

33 Claims, 3 Drawing Sheets

U.S. PATENT DOCUMENTS

| | | | |
|---|---|---|---|
| 6,172,382 B1 | 1/2001 | Nagahama et al. | |
| 6,603,243 B2 * | 8/2003 | Parkyn et al. | 313/113 |
| 6,641,284 B2 | 11/2003 | Stopa et al. | |
| 6,642,547 B2 | 11/2003 | Matsubara et al. | |
| 6,657,375 B2 | 12/2003 | Goud | |
| 6,849,881 B1 | 2/2005 | Harie et al. | |
| 7,066,626 B2 | 6/2006 | Omata | |
| 2002/0172039 A1 * | 11/2002 | Inditsky | 362/231 |
| 2003/0025449 A1 | 2/2003 | Rossner | |
| 2003/0095406 A1 * | 5/2003 | Lebens et al. | 362/231 |
| 2003/0201451 A1 | 10/2003 | Suehiro et al. | |
| 2004/0026709 A1 * | 2/2004 | Bader et al. | 257/103 |
| 2004/0046489 A1 | 3/2004 | Vetorino et al. | |
| 2004/0070337 A1 | 4/2004 | Goh et al. | |
| 2004/0120155 A1 * | 6/2004 | Suenaga | 362/362 |
| 2004/0211970 A1 | 10/2004 | Hayashimoto et al. | |
| 2004/0238338 A1 * | 12/2004 | Ganz et al. | 200/262 |
| 2004/0264185 A1 | 12/2004 | Grotsch et al. | |
| 2005/0139846 A1 | 6/2005 | Park et al. | |
| 2005/0173692 A1 * | 8/2005 | Park et al. | 257/13 |

FOREIGN PATENT DOCUMENTS

| | | |
|---|---|---|
| DE | 19813650 | 7/1999 |
| DE | 10319274 | 12/2004 |
| EP | 1 017113 | 7/2000 |
| EP | 1 467417 | 10/2004 |
| JP | 2002-299698 | 10/2002 |
| JP | 3091911 | 11/2002 |
| JP | 2004-327955 | 11/2004 |
| JP | 2005-197633 | 7/2005 |
| TW | 581847 | 4/2004 |
| TW | 595019 | 6/2004 |
| WO | WO 98/12757 | 3/1998 |
| WO | WO 98/31055 | 7/1998 |
| WO | WO 01/39282 | 5/2001 |
| WO | WO 2004/053933 | 6/2004 |

OTHER PUBLICATIONS

Authorized officer: Hedouin, M., *International Search Report*, PCT/DE2005/000904, Feb. 22, 2006.

"Translation of the Notification of Reasons for Refusal", Japanese Patent Application No. 2007-519604, mailed on Nov. 26, 2010 (5 pages).

* cited by examiner

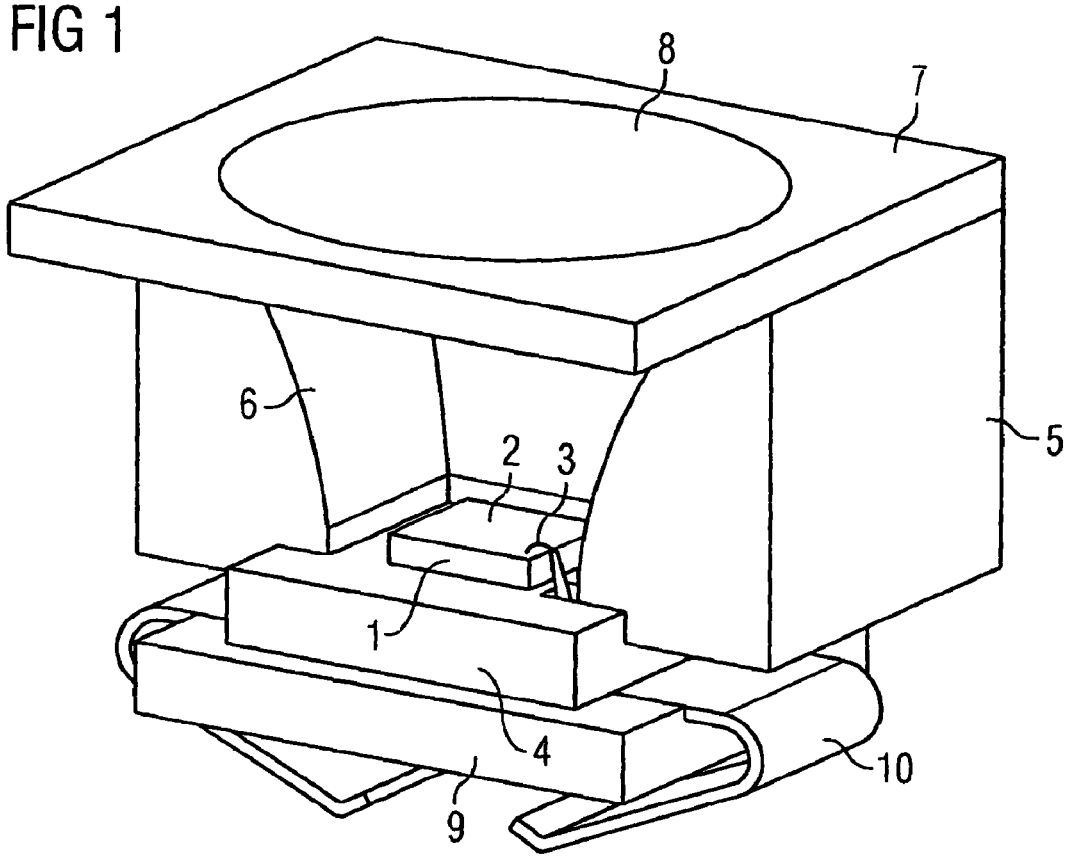
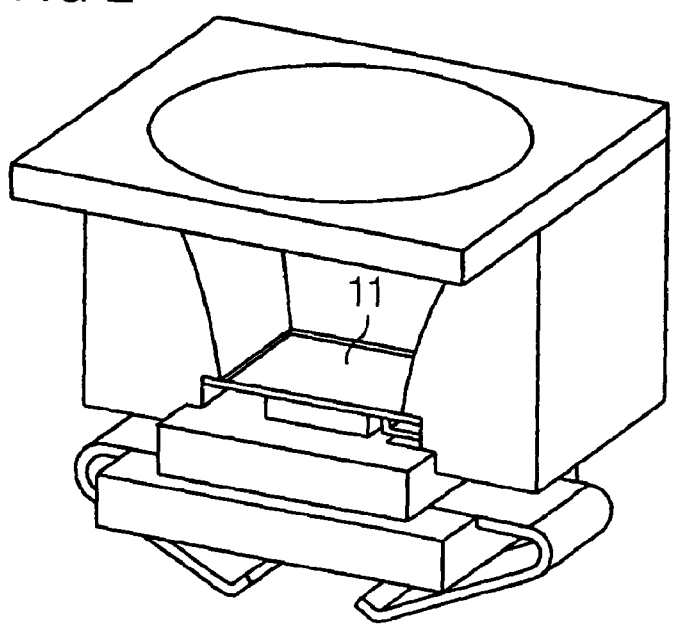

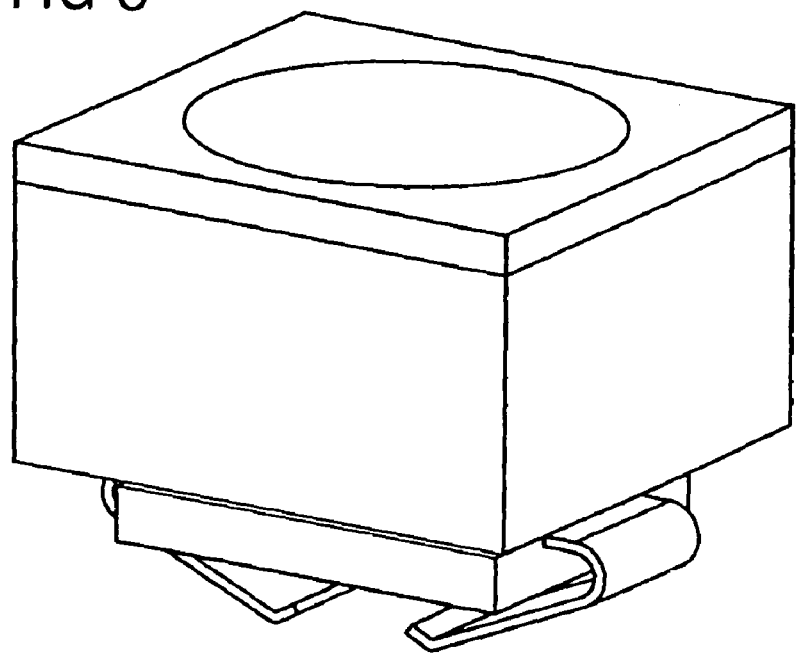
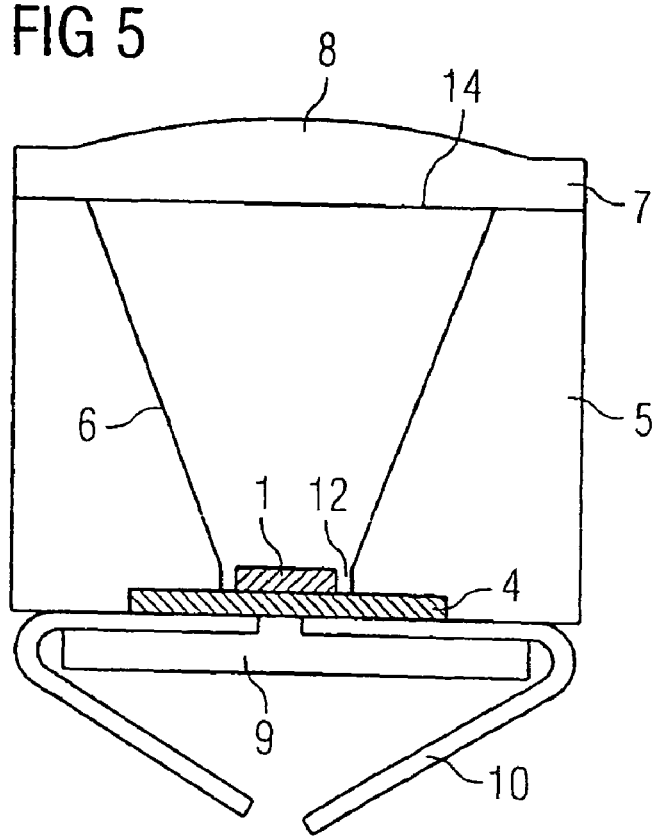

LIGHT-EMITTING DIODE ARRANGEMENT

CROSS-REFERENCE TO RELATED APPLICATIONS

This application is the National Stage of International Application No. PCT/DE2005/000904, filed on May 18, 2005, which claims the priority to German Patent Applications Serial No. 10 2004031686.4, filed on Jun. 30, 2004 and Serial No. 10 2004045947.9, filed on Sep. 22, 2004. The contents of all applications are hereby incorporated by reference in their entireties.

FIELD OF THE INVENTION

The invention relates to a light-emitting diode arrangement.

BACKGROUND OF THE INVENTION

The document U.S. Pat. No. 6,657,375 B2 describes a light-emitting diode (LED) arrangement comprising at least one LED, which emits light that exits from the sides and the top of the LED. The emitted light is partially or completely converted into longer-wave radiation by means of phosphors which are exposed to the primary radiation from the LED. The LED chip is disposed in a recess of the housing. The walls of the housing are implemented as reflective, and the recess is filled with a potting compound that completely envelops the LED chip. The phosphor particles are mixed into this potting compound to convert the light given off by the LED chip.

SUMMARY OF THE INVENTION

It is the object of the present invention to disclose an LED arrangement with a particularly high light output. This object is achieved by means of an LED arrangement.

According to at least one embodiment of the LED arrangement, an LED arrangement is disclosed that preferably comprises at least one LED chip. The LED chip preferably has a radiation decoupling surface through which a large portion of the electromagnetic radiation generated in the LED chip exits.

The radiation preferably exits in the direction of a main direction of emission. Particularly preferably, the radiation generated in the LED chip exits solely through the radiation decoupling surface. Said radiation decoupling surface is preferably one of the main faces of the LED chip. The side faces of the LED chip, extending transversely to the main faces, are preferably implemented as impermeable to radiation. These chip faces can in this case be implemented for example as reflective or absorptive of radiation.

The LED arrangement further preferably comprises a housing that surrounds the LED chip laterally. That is, the side faces of the LED chip are surrounded by the housing. The side faces preferably extend perpendicularly or substantially perpendicularly to the radiation decoupling surface of the LED chip.

The LED arrangement further preferably comprises a reflective optic. The reflective optic is preferably disposed after the radiation decoupling surface in the main direction of emission. That is, at least a portion of the radiation emitted by the LED chip strikes the reflective optic and is reflected by it.

Hence, the LED arrangement preferably comprises an LED chip with a radiation decoupling surface through which a large portion of the electromagnetic radiation generated in the LED chip exits in the main direction of emission, and further, a housing laterally surrounding the LED chip and a reflective optic disposed after the radiation decoupling surface in the main direction of emission.

The LED chip preferably comprises an epitaxially grown layer stack. The layer stack is for example a sequence of epitaxially grown layers. The layer stack preferably includes at least one active region suitable for generating electromagnetic radiation. The active region is preferably suitable for generating electromagnetic radiation in the blue or ultraviolet region of the spectrum.

To this end, the active region can comprise for example a pn junction, a double heterostructure, a single quantum well or, particularly preferably, a multiple quantum well (MQW) structure. Such structures are known to those skilled in the art and thus will not be elaborated on herein. Examples of MQW structures are described in the documents WO 01/39282, WO 98/31055, U.S. Pat. No. 5,831,277, EP 1 017 113 and U.S. Pat. No. 5,684,309, whose disclosure content in regard to MQW structures is hereby incorporated by reference.

The layer stack is particularly preferably a sequence of epitaxially grown layers from which the growth substrate was removed after the epitaxial growth was completed. Particularly preferably, a carrier is applied to the surface of the layer stack facing away from the original growth substrate. Components that are fabricated by removing the growth substrate from an epitaxially grown layer sequence are also commonly known as thin film components.

A basic principle of a thin-film LED chip is described, for example, in I. Schnitzer et al., *Appl. Phys. Lett.* 63 (16), 18 Oct. 1993, 2174-2176, whose disclosure content in regard to the basic principle of thin film components is hereby incorporated by reference.

A thin-film LED is, as a good approximation, a Lambertian surface radiator, and is therefore particularly well suited for use for example in a floodlight.

It is particularly advantageous that the carrier can be relatively freely selected compared to the growth substrate. For instance, with respect to many properties, such as conductivity or stability, the carrier can be better suited to the component than available growth substrates, which are subject to tight limitations in connection with the production of high-quality epitaxially grown layer sequences. For example, in order to obtain high-quality epitaxial layers, the epitaxially deposited material must be lattice-matched to the growth substrate.

The carrier applied to the layer stack is preferably distinguished by a thermal expansion coefficient that is matched to the layer stack. The carrier can, for example, contain a semiconductor material such as germanium, gallium arsenide, gallium nitride, silicon carbide and other materials such as sapphire, molybdenum or metals.

In addition, the carrier is preferably distinguished by a particularly good thermal conductivity, so that the heat generated in the active region during the production of electromagnetic radiation can be at least partially dissipated to the environment through the carrier.

According to a preferred configuration of the LED chip, a mirror layer is disposed between the applied carrier and the layer stack. The mirror layer can for example include a Bragg mirror or a metal-containing mirror layer. A metal-containing mirror, which can for example contain gold, gold germanium, silver, aluminum or platinum, is distinguished for example by a less directionally dependent reflectivity than a Bragg mirror. In addition, a higher reflectivity can be achieved with metal-containing mirrors than with Bragg mirrors.

In at least one embodiment of the LED arrangement, the LED chip is suitable for generating particularly brief light pulses. For example, the LED chip is suitable for generating flash illumination with a flash duration of no more than 200 ms. The flash duration is preferably no more than 120 ms, particularly preferably no more than 100 ms.

In at least one embodiment of the LED arrangement, the LED chip is suitable for generating electromagnetic radiation in continuous operation. The LED chip is preferably suitable for supplying light of roughly consistent intensity for at least 5 min. "Of roughly consistent intensity" means in this context that there may be slight fluctuations in light intensity, for example due to fluctuations in the power supply or to thermal effects. However, these are so slight as to be imperceptible to the human eye.

According to at least one embodiment of the LED arrangement, the LED chip is suitable for generating both flashing light with a flash duration of no more than 200 ms, preferably no more than 120 ms, particularly preferably no more than 100 ms, and for emitting electromagnetic radiation of roughly consistent intensity for at least five minutes in continuous operation.

In accordance with at least one embodiment of the LED arrangement, the reflective optic has a light entrance opening through which a large portion of the electromagnetic radiation generated in the LED chip enters the reflective optic. Said light entrance opening of the reflective optic is preferably disposed after the radiation decoupling surface of the LED chip in the main direction of emission. The area of the light entrance opening is preferably no more than twice, particularly preferably no more than 1.05 to 1.20 times, that of the radiation decoupling surface of the LED chip. Such a small entrance opening in the reflective optic has proven especially advantageous since it permits significant miniaturization of the LED arrangement.

If the LED arrangement comprises more than one LED chip after which the reflective optic is disposed, then the area of the light entrance opening is preferably no more than twice, particularly preferably no more than 1.05 to 1.20 times, the sum of the areas of the radiation decoupling surfaces of the LED chip.

According to at least one embodiment of the LED arrangement, the reflective optic has a light exit opening. Electromagnetic radiation entering the reflective optic through the light entrance opening preferably leaves the reflective optic through the light exit opening. The light exit opening is preferably disposed after the light entrance opening in the main direction of emission of the electromagnetic radiation generated by the LED chip.

Particularly preferably, the reflective optic comprises reflective side walls between the light entrance opening and the light exit opening. The reflective side walls are preferably implemented such that they reflect at least a portion of the electromagnetic radiation entering through the light entrance opening in the direction of the light exit opening.

According to at least one embodiment of the LED arrangement, the reflective optic comprises side walls provided with a layer or layer sequence, preferably with a metallic layer, which is reflective of light emitted by the semiconductor chip.

In at least one embodiment of the LED arrangement, the reflective optic is integrated into the housing that laterally surrounds the LED chip. That is, the side walls of the reflective optic are formed for example by the inner walls of the housing facing toward the LED chip. This is achieved for example by providing the inner walls of the housing with a reflective coating. Such coating of the housing inner walls again is preferably constituted by a metallic layer or layer sequence.

Alternatively, the base body of the reflective optic is advantageously formed of a dielectric material with a suitable refractive index. In this way, light that is coupled in through the light entrance opening is reflected by total reflection from the housing walls connecting the light entrance opening to the light exit opening. This has the advantage that practically no light losses due to reflection occur in the reflective optic. In this embodiment of the LED arrangement, it also advantageously becomes possible for the housing to be constituted by the base body of the reflective optic. The LED arrangement can advantageously be produced at particularly low cost in this manner.

In at least one embodiment of the LED arrangement, the reflective optic is formed such that it reduces the divergence of the radiation emitted by the LED chip. That is, the electromagnetic radiation entering the reflective optic through the light entrance opening has a greater divergence when the light enters than it does when the light exits through the light exit opening of the reflective optic. The reflective optic is preferably a non-imaging optic.

According to at least one embodiment, the reflective optic is an optical concentrator, the light entrance opening of the reflective optic being in effect the light exit opening of the concentrator. Particularly preferably, the reflective optic is a non-imaging optical concentrator. Compared to the customary use of an optical concentrator for focusing, the light travels through the optical concentrator in the opposite direction and therefore is not concentrated, but leaves the concentrator through the light exit opening with reduced divergence.

In at least one embodiment of the LED arrangement, the reflective optic is constituted at least partially in the manner of a Compound Parabolic Concentrator (CPC), a Compound Elliptic Concentrator (CEC), a Compound Hyperbolic Concentrator (CHC) or a TIR (Total Internal Reflection) optic. That is, the reflective side walls of the reflective optic are constituted at least partially in the form of a CPC, CEC, CHC or TIR. Furthermore, it is advantageously possible for the reflective optic to be constituted as a combination of these optical elements. A reflective optic configured in this way advantageously permits efficient reduction of the divergence of the electromagnetic radiation generated by the LED chip, and thus a well-defined radiation characteristic for the LED arrangement.

In at least one embodiment of the LED arrangement, the reflective optic comprises a light exit opening through which a large portion of the electromagnetic radiation generated in the LED chip leaves the reflective optic. Such a light exit opening of the reflective optic is disposed after a covering body in the main direction of emission. This covering body is preferably at least partially transparent to the electromagnetic radiation. The covering body preferably serves to protect the reflective optic and the LED chip against dust particles and dirt particles and against mechanical effects. Particularly preferably, the covering body is implemented as a housing cap for the LED arrangement. In that case, the covering body can advantageously serve as a guide or stop during the mounting of the LED arrangement in a system housing, and therefore makes it possible to mount the LED arrangement in the system housing in a simple and mechanically stable way. The covering body particularly preferably serves as a guide and stop.

That is, the LED arrangement can for example be intended to be dropped into a recess of a system housing. In that case, the covering body and the recess are adapted to each other such that the covering body serves as a guide and/or stop during the mounting of the LED arrangement.

According to at least one embodiment of the LED arrangement, the covering body comprises an optical element. That is, preferably integrated into the covering body is an optic that serves to bend, refract or wavelength-convert the electromagnetic radiation exiting from the light exit opening of the reflective optic. Particularly preferably, the optical element performs at least two of these functions. The optical element is preferably a non-imaging optic.

In at least one embodiment, the optical element comprises a light exit face that can for example be spherically or aspherically curved. Further reduction of the divergence of the electromagnetic radiation exiting the LED arrangement can be achieved in this way.

The light exit face is preferably curved in the manner of an aspherical lens. That is, the light exit opening is an optical surface that is neither spherical nor planar and serves to refract the exiting light bundle. Particularly preferably, an optical element so formed can comprise a multiplicity of shape parameters by means of which allowance can be made for example for the size of the radiation decoupling surface of the LED chip and/or the light exit opening of the reflective optic. Spherical lenses, by contrast, are ideal for punctiform light sources, but when used with non-punctiform light sources may have significantly poorer properties in terms of their ability to reduce the divergence of the exiting light bundle.

In at least one embodiment of the LED arrangement, the optical element is constituted in the manner of a Fresnel lens. Fresnel lenses are also suitable for reducing the divergence of the exiting radiation. Particularly advantageously, Fresnel lenses are notable for a particularly inexpensive production process.

In at least one embodiment of the LED arrangement, disposed after the LED chip in the main direction of emission is a luminescence conversion material that wavelength-converts at least a portion of the electromagnetic radiation emitted by the LED chip. The luminescence conversion material advantageously contains at least one kind of phosphor particle. Suitable for this purpose are, for example, inorganic phosphors such as rare earths, doped garnets (for example YAG:Ce) or organic phosphors such as perylene phosphors. Further suitable phosphors are listed for example in the document WO 98/12757, whose content in regard to phosphors is hereby incorporated by reference.

With the aid of the luminescence conversion material, visible light of a desired locus on the CIE chromaticity diagram, particularly white light, can be produced either by largely completely converting a primary radiation from the LED chip or by deliberately partially converting and mixing primary radiation and converted radiation.

According to at least one embodiment of the LED arrangement, the luminescence conversion material is applied as a thin layer to the radiation decoupling surface of the LED chip. Particularly preferably, the layer thickness is no more than 50 µm. The minimum thickness of the luminescence conversion layer is about 5 µm. Such a luminescence conversion layer advantageously comprises a luminescence conversion material/matrix mixture. The matrix is formed for example of duroplastic polymers or silicone. The concentration of luminescence conversion material is advantageously high.

It has proven particularly advantageous in this embodiment of the LED arrangement for a large portion of the electromagnetic radiation generated by the LED chip to exit through the radiation decoupling surface. Since the luminescence conversion layer is applied directly to the radiation decoupling surface, this arrangement permits particularly efficient and defined conversion of the exiting radiation. That is, the bulk of the electromagnetic radiation exiting the LED chip is wavelength-converted into light of a predefinable hue.

In at least one embodiment of the LED arrangement, a lamina containing luminescence conversion material is disposed after the radiation decoupling surface of the LED chip in the main direction of emission. The thickness of the lamina is preferably no more than 200 µm. The minimum thickness of the lamina is preferably around 10 µm. The lamina can for example contain a plastic material into which the luminescence conversion material is incorporated. It is also, however, possible for the lamina to be coated with a layer of luminescence conversion material. The lamina can then be formed for example of glass. Particularly advantageously, an LED arrangement comprising such a lamina can be fabricated particularly simply and inexpensively. In addition, it furnishes the option of changing the color locus of the light emitted by the LED arrangement in a particularly simple manner by replacing the lamina.

In at least one embodiment of the LED arrangement, the optical element contains a luminescence conversion material, that is, the optical element reduces the divergence of the exiting radiation and simultaneously contributes to the wavelength conversion of that radiation. This embodiment of the LED arrangement advantageously permits the fabrication of particularly low-cost LED arrangements. If the optical element contains a plastic, then the luminescence conversion material can advantageously be incorporated into said plastic. It is also possible, however, for the optical element to be coated with the luminescence conversion material. Particularly advantageously, the optical element can be formed of glass.

According to at least one embodiment of the LED arrangement, the reflective optic contains a luminescence conversion material. That is, the reflective optic reduces the divergence of the exiting light and simultaneously contributes to the wavelength conversion of the electromagnetic radiation emitted by the LED chip. The concentration of luminescence conversion material in the reflective optic can be distributed in various ways, depending on the requirements to which the light emitted by the LED arrangement is subject. For instance, a particularly high concentration of luminescence conversion material can be present for example in the region of the reflective optic facing the LED. It is also possible, however, for the concentration of luminescence conversion material to be particularly high in the center, in the radiation exit region of the reflective optic. Defined conversion of the exiting radiation can be achieved overall by varying the concentration of luminescence conversion material.

According to at least one embodiment of the LED arrangement, the included angle of a cone of light exiting from the light exit of the LED arrangement, for example the light exit surface of the optical element, is no more than 35°. Particularly preferably, the included angle is between 25° and 35°. "Cone of light" in this context means a volume illuminated by the light emitted from the light exit of the LED arrangement, excluding regions in which the brightness is more than one order of magnitude lower than the maximum brightness at equal distance from the light exit. The term "cone of light" in this sense does not refer to the shape of a cone in the mathematical sense, and a cone of light can therefore have more than one included angle. If that is the case, then the above data regarding the included angle refer to the maximum included angle. Particularly preferably, in such a case the LED arrangement is suitable for irradiating an area about five to six square meters in size at a distance of three meters with light of at least ten lux. The LED arrangement then comprises one or more LED chips with a total radiation decoupling area of about one square millimeter.

In at least one embodiment of the LED arrangement, the area irradiated by the LED arrangement is rectangular in shape. The sides of the rectangular area are preferably in a mutual ratio of four to three.

According to at least one embodiment of the LED arrangement, the LED chip is mounted by its surface opposite from the radiation decoupling surface on a cooling body. The cooling body contains for example one of the following materials: ceramic, semiconductor materials, metals. The cooling body advantageously has a high thermal conductivity and is matched in thermal expansion coefficient to the material of the LED chip. The LED chip is preferably soldered or glued to the cooling body. The adhesive bond is preferably distinguished by high thermal conductivity. Electrical contact areas are preferably disposed in a mutually insulated manner on the surface of the cooling body facing away from the LED chip. The electrical contact areas are preferably each connected to the respective interconnects of the LED chip. The LED chip can be electrically contacted via the electrical contact areas.

According to at least one embodiment of the LED arrangement, the cooling body is mounted by its side facing away from the LED chip on a carrier. Particularly preferably, disposed between the carrier and the cooling body in this case are contact springs, which are connected to the contact areas on the surface of the cooling body facing away from the LED chip.

The contact springs are preferably bent at an acute angle around the carrier. The bend in the contact springs is advantageously shaped such that the bending forces do not act on the mounting connection between the cooling body and the carrier. The springs are preferably soldered onto the cooling body and the carrier.

According to at least one embodiment of the LED arrangement, its outer dimensions are equal to no more than four millimeters in at least one spatial direction. Particularly preferably, the outer dimensions of the LED arrangement are equal to no more than four millimeters in all three spatial directions. This advantageously enables the LED arrangement to be used in relatively small devices. It is particularly preferred to use the LED arrangement in one of the following devices: cell phones, video cameras, still cameras. The LED arrangement can be used in these devices both as a flash or for the continuous illumination of, for example, film scenes. It has proven particularly advantageous in such cases that the LED arrangement permits particularly efficient cooling of the LED chip. The LED chip can thus be operated at high power levels. This permits illumination at a high light intensity for long periods of time without the LED arrangement overheating.

The LED arrangement described herein will be explained in more detail with reference to exemplary embodiments and the associated figures.

BRIEF DESCRIPTION OF THE DRAWINGS

FIG. 1 is a schematic three-dimensional sectional view of a first exemplary embodiment of the LED arrangement described herein.

FIG. 2 is a schematic three-dimensional sectional view of a second exemplary embodiment of the LED arrangement described herein.

FIG. 3 is a three-dimensional view of an exemplary embodiment of the LED arrangement described herein.

FIG. 5 is a schematic view of a further exemplary embodiment of the LED arrangement described herein.

DETAILED DESCRIPTION OF THE PREFERRED EMBODIMENTS

Figure 4:
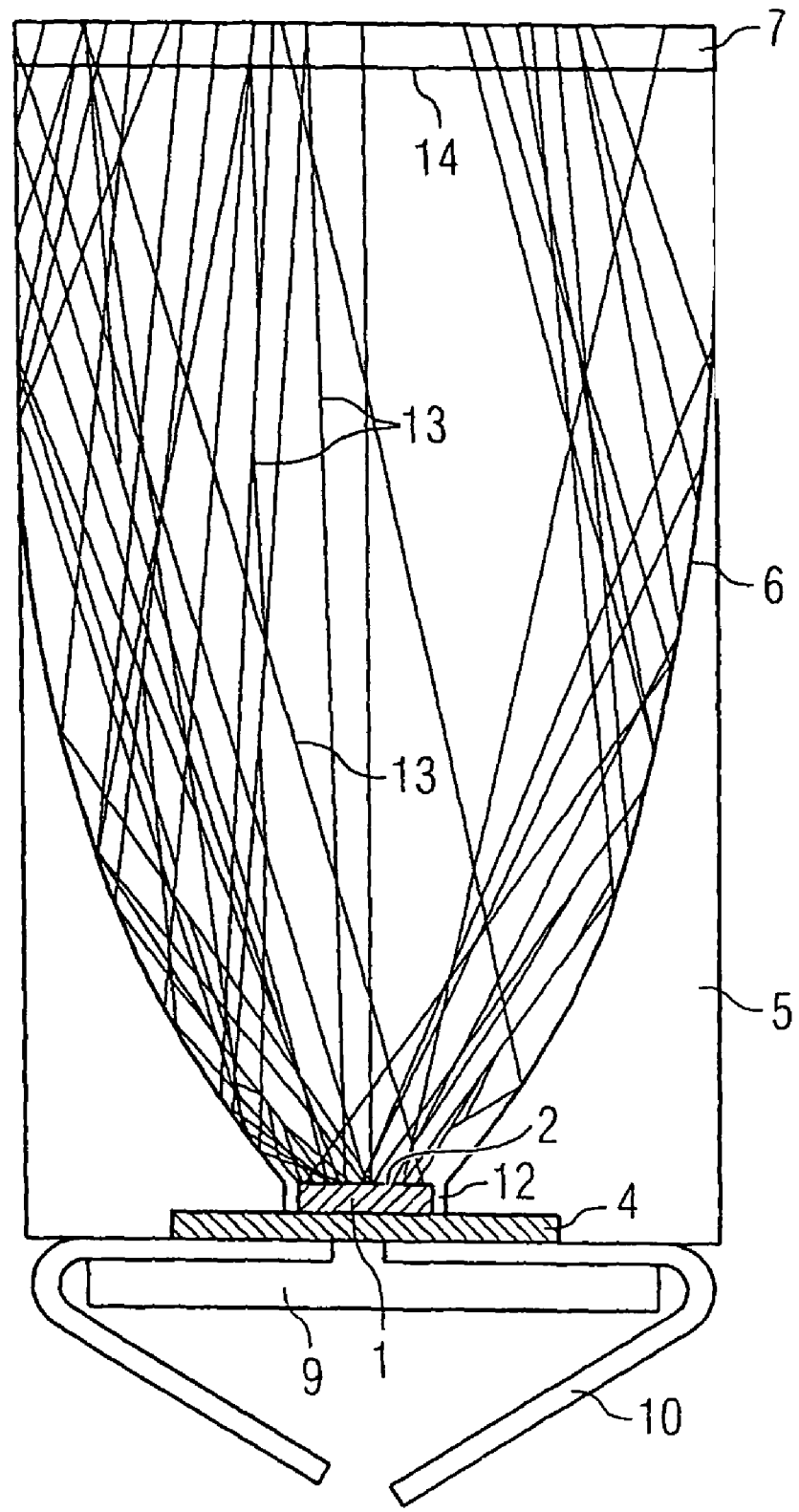
FIG. 4 is a schematic sectional view of an exemplary embodiment of the LED arrangement described herein.

In the exemplary embodiments and figures, elements of the same kind or identically acting elements are each provided with the same respective reference numerals. The elements shown and the size relationships between the elements are not to be considered true to scale. Rather, some details of the figures have been depicted as exaggeratedly large for the sake of better understanding.

FIG. 1 is a schematic three-dimensional sectional view of a first exemplary embodiment of the LED arrangement described herein.

The LED chip 1 of the LED arrangement is preferably an LED chip 1 of thin-film construction, as described in the general part of the description. The LED chip 1 is distinguished above all by its advantageously small area.

The electromagnetic radiation generated by the active region of the LED chip 1 exits for the most part through the radiation decoupling surface 2. The size of the radiation decoupling surface is about one square millimeter.

Disposed after radiation decoupling surface 2 in the main direction of emission of the LED chip 1 is for example a layer of luminescence conversion material (not shown), which is applied to radiation decoupling surface 2. Said layer of luminescence conversion material at least partially wavelength-converts the light exiting from radiation decoupling surface 2. Light-mixing of the primary radiation emitted by the LED chip and the wavelength-converted portion of the radiation preferably yields white light.

The luminescence conversion layer advantageously contains a luminescence conversion material/matrix mixture. The matrix is formed for example of duroplastic polymers such as epoxy materials or silicone materials. The concentration of luminescence conversion material is advantageously high. Particularly preferably, between 30 and 50 volume percent of phosphor material is mixed into the matrix.

A bond pad 3 through which the chip can be electrically contacted is disposed for example laterally on radiation decoupling surface 2.

By its main face disposed opposite radiation decoupling surface 2, the LED chip 1 is mounted on the cooling body 4. The cooling body 4 preferably serves as a heat sink. It contains for example a ceramic material such as for example AlN, a semiconductor material such as for example silicon, or a metal composite. Cooling body 4 can advantageously also contain a combination of these materials. The LED chip 1 is preferably attached to the cooling body 4 by soldering or by adhesive bonding with a high-temperature conductive adhesive.

Cooling body 4 serves to absorb and pass on the heat generated by the LED chip 1 in operation. Cooling body 4 preferably comprises through-contacts (vias) for electrically contacting the LED chip 1.

Disposed on cooling body 4 is a housing 5 that laterally surrounds the LED chip 1. Said housing preferably completely surrounds the LED chip 1 laterally. Said housing 5 can comprise at least one of the following materials: $Al_2O_3$, AlN, ZO, FeNi, Kovar, Cu, molybdenum, LCP, PPA, PEEK.

Integrated into the inner wall of housing 5, disposed on the inner wall of housing 5 or formed by the inner wall of the housing is a reflective optic 6, which is suitable for reflecting the—where applicable, wavelength-converted—light emitted by the LED chip and thereby reducing the divergence of the exiting radiation. In this case, reflective optic 6 is preferably constituted in the manner of a CPC, CEC, CHC, a TIR (total internal reflection) optic or a combination of these optical elements. The reflective optic is preferably a non-imaging optic.

Disposed after housing 6 is a covering body 7, into which is integrated an optical element 8 formed by a non-imaging optic. The optical element is also suitable for reducing the divergence of the radiation exiting from the LED arrangement.

Disposed on the surface of cooling body 4 facing away from LED chip 1 are a carrier 9 and contact springs 10. The carrier 9 also serves to dissipate the heat generated by the LED chip in operation and is distinguished by a high thermal conductivity. The LED chip 1 can advantageously be operated at currents of between 0.5 and 1.0 A. Due to the efficient cooling, the LED chip can emit high-intensity electromagnetic radiation even for relatively long periods of time without the arrangement overheating. To this end, carrier 9 preferably comprises or is made of an electrically insulating material. Particularly preferably, the carrier comprises for example plastics or carbon fiber filled plastics.

The contact springs 10 contain for example $CuFe_2P$ or CuBe and serve for example as heat conducting elements to dissipate the heat generated by the LED chip 1 in operation. It is also possible for the LED chip 1 to be electrically contacted by means of the contact springs 10. Carrier 9 and springs 10 additionally permit height compensation during the mounting of the LED arrangement in a system housing. That is, the LED arrangement can be adapted to the depth of a recess in the system housing by adjusting for example the thickness of the carrier 9 and/or the angle at which the springs 10 are bent around the carrier 9 and/or the length of the springs 10.

FIG. 2 shows an LED arrangement that differs from the just-described exemplary embodiment in that instead of a conversion layer being disposed on the radiation decoupling surface 2 of the LED chip 1, a lamina 11 is disposed after radiation decoupling surface 2. This lamina 11 can for example contain a plastic material with an admixture of luminescence conversion material, or it can be constituted by a glass plate coated with a luminescence conversion material on one of its two main faces extending parallel to radiation decoupling surface 2. The lamina serves to wavelength-convert at least a portion of the electromagnetic radiation emitted by the LED chip 2.

FIG. 3 shows the LED arrangement with all four side walls closed. The dimensions of the LED arrangement are preferably about 4×4×4 mm. Due to these small dimensions, the LED arrangement can advantageously be installed even in relatively small electronic devices such as camera-equipped cell phones or digital cameras.

FIG. 4 shows an exemplary embodiment of the LED arrangement in a sectional view. From radiation decoupling surface 2, the electromagnetic radiation 13 generated in the LED chip 1 enters the reflective optic 6, here constituted by a CPC-type optical concentrator. The CPC-type optical concentrator is distinguished by its parabolically shaped lateral faces. The optical concentrator is used in the reverse direction to reduce the divergence of the radiation 13 emitted by the LED chip 1. That is, the light entrance opening 12 of the reflective optic 6 is in effect the light exit opening of the optical concentrator, whereas the light exit opening 14 of the reflective optic 6 is in effect the light entrance opening of the optical concentrator. The reflective optic is here constituted for example by a reflective coating formed by a layer or layer sequence composed for example of a metal layer made of silver.

FIG. 5 shows a further exemplary embodiment of the LED arrangement in a sectional view.

The reflective optic 6 here comprises side walls that extend in a straight line from the light entrance opening 12 of optical element 6 to the light exit opening 14 of optical element 6.

The side walls of the optical element are for example reflectively coated in this case. In this exemplary embodiment of the LED arrangement, therefore, the side walls of reflective optic 6 form a truncated pyramid or truncated cone. The side walls of this optical element 6 can be for example reflectively coated.

In addition, disposed after light exit opening 14 of reflective optic 6 is a second optical element 8, which is convexly curved in the manner of a spherical or aspherical lens and is additionally suitable for reducing the divergence of the exiting electromagnetic radiation.

Alternatively to the reflectively coated side walls, reflective optic 6 can be a solid body containing a dielectric material. The material of said solid body has for example a refractive index such that electromagnetic radiation coupled in through light entrance opening 12 is reflected by total reflection at the lateral boundary surfaces of the solid body with the surrounding medium. In this case it is also possible in particular for said second optical element 8 to be constituted by a convex boundary surface of the solid body. In this exemplary embodiment, it is possible in particular for dielectric material to be cast around the LED chip 1.

The invention is not limited by the description made with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. An LED arrangement, comprising:
   at least one LED chip provided with a radiation decoupling surface and having a surface opposite the radiation decoupling surface, wherein a large portion of the electromagnetic radiation generated in the LED chip exits through the radiation decoupling surface in a main direction of emission;
   a housing laterally surrounding said LED chip, and
   a reflective optic disposed after said radiation decoupling surface in said main direction of emission, wherein said LED chip is a thin-film LED chip, wherein said reflective optic comprises a light entrance opening through which a large portion of the electromagnetic radiation generated in said LED chip enters, and the area of said light entrance opening is no more than twice that of said radiation decoupling surface of said LED chip,
   wherein said radiation decoupling surface is one of the main faces of the LED chip, and side faces of said LED chip extend transversely to said radiation decoupling surface.

2. The LED arrangement as in claim 1, wherein said LED chip is suitable for generating flash illumination with a period of illumination of no more than 200 ms.

3. The LED arrangement as in claim 1, wherein said LED chip is suitable for providing illumination for at least 5 min in continuous operation.

4. The LED arrangement as in claim 1, wherein said reflective optic comprises a light entrance opening through which a large portion of the electromagnetic radiation generated in said LED chip enters, and the area of said light entrance opening is no more than twice that of said radiation decoupling surface of said LED chip.

5. The LED arrangement as in claim 1, wherein said reflective optic is suitable for reducing the divergence of said electromagnetic radiation emitted by said LED chip.

6. The LED arrangement as in claim 1, wherein said reflective optic is a non-imaging optic.

7. The LED arrangement as in claim 1, wherein an included angle of a cone of light exiting from said LED arrangement is no more than 35°.

8. The LED arrangement as in claim 1, wherein said cooling body comprises through-contacts.

9. The LED arrangement as in claim 1, wherein the surface of said cooling body facing away from said LED chip comprises contact areas.

10. The LED arrangement as in claim 1, wherein said housing is attached to said cooling body.

11. The LED arrangement as in claim 1, wherein the outer dimensions of said LED arrangement are equal to no more than 4×4×4 mm.

12. The use of an LED arrangement as in claim 1 in one of the following devices: cell phone, video camera, still camera.

13. The LED arrangement as in claim 1, wherein said semiconductor material contains at least one of the materials: germanium, gallium arsenide, gallium nitride, or silicon carbide.

14. The LED arrangement as in claim 1, wherein said reflective optic is an optical concentrator, said light entrance opening being in effect the light exit opening of said concentrator.

15. The LED arrangement as in claim 14, wherein said reflective optic is constituted at least partially in the manner of at least one of the following optical elements: compound parabolic concentrator, compound elliptic concentrator, compound hyperbolic concentrator, total internal reflection.

16. The LED arrangement as in claim 1, wherein the LED chip comprises an epitaxially grown layer stack, which includes at least one active region suitable for generating electromagnetic radiation, and wherein a carrier is applied to the surface of the layer stack facing away from an original substrate, and a mirror layer is disposed between the applied carrier and the layer stack.

17. The LED arrangement as in claim 16, wherein said mirror layer includes a Bragg mirror or a metal-containing layer.

18. The LED arrangement as in claim 1, wherein said reflective optic comprises a light exit opening through which a large portion of said electromagnetic radiation generated in said LED chip exits from said reflective optic, and a covering body is disposed after said light exit opening in said main direction of emission.

19. The LED arrangement as in claim 18, wherein said covering body serves as a guide and/or stop during the mounting of said LED arrangement in a system housing.

20. The LED arrangement as in claim 18, wherein said covering body comprises an optical element.

21. The LED arrangement as in claim 20, wherein said optical element comprises a light exit surface that is curved in the manner of an aspherical lens.

22. The LED arrangement as in claim 20, wherein said optical element is formed in the manner of a Fresnel lens.

23. The LED arrangement as in claim 1, wherein disposed after said LED chip in said main direction of emission is a luminescence conversion material that wavelength-converts at least a portion of said electromagnetic radiation emitted by said LED chip.

24. The LED arrangement as in claim 23, wherein said luminescence conversion material is applied as a layer to said radiation decoupling surface, the thickness of said layer being no more than 50 μm.

25. The LED arrangement as in claim 23, wherein a lamina comprising said luminescence conversion material is disposed after said radiation decoupling surface, the thickness of said lamina being no more than 200 μm.

26. The LED arrangement as in claim 23, further comprising an optical element, wherein said optical element comprises said luminescence conversion material.

27. The LED arrangement as in claim 1, wherein said cooling body is disposed by its surface facing away from said LED chip on a carrier.

28. The LED arrangement as in claim 27, wherein attached to said carrier are contact springs comprising at least one of the following materials: CuFeP, CuBe.

29. The LED arrangement as in claim 28, wherein at least portions of said contact springs are disposed between said cooling body and said carrier, and said contact springs are bent at an acute angle around said carrier.

30. A LED arrangement as in claim 1, wherein said LED chip comprises an epitaxially grown layer stack, which includes at least one active region suitable for generating electromagnetic radiation.

31. A LED arrangement as in claim 30, wherein a carrier is applied to the surface of the layer stack facing away from an original growth substrate.

32. A LED arrangement as in claim 31, wherein said carrier contains a semiconductor material.

33. An LED arrangement, comprising:
   at least one LED chip provided with a radiation decoupling surface and having a surface opposite the radiation decoupling surface, a large portion of the electromagnetic radiation generated in the LED chip exits through the radiation decoupling surface in a main direction of emission;
   a housing laterally surrounding said LED chip,
   a reflective optic disposed after said radiation decoupling surface in said main direction of emission, said surface of the LED chip opposite said radiation decoupling surface is disposed on a cooling body, wherein said cooling body is disposed by its surface facing away from said LED chip on a carrier, attached to said carrier are contact springs, and at least portions of said contact springs are disposed between said cooling body and said carrier, and said contact springs are bent at an acute angle around said carrier.

* * * * *